United States Patent
Hu et al.

(10) Patent No.: US 7,015,836 B2
(45) Date of Patent: Mar. 21, 2006

(54) EFM DATA DECODING METHOD AND APPARATUS THEREOF FOR OPTICAL DISK SYSTEM

(75) Inventors: Pei-Jei Hu, Taipei Hsien (TW); S L Ouyang, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/906,659

(22) Filed: Mar. 1, 2005

(65) Prior Publication Data

US 2005/0200503 A1  Sep. 15, 2005

(30) Foreign Application Priority Data

Mar. 3, 2004  (TW) ............................... 93105482 A

(51) Int. Cl.
*H03M 7/00* (2006.01)

(52) U.S. Cl. ............................ 341/50; 341/58; 341/59; 341/94; 341/106; 369/53.35; 714/746; 714/756; 714/758; 714/759; 714/798; 714/800

(58) Field of Classification Search ................. 341/50, 341/58–59, 94, 106; 369/53.35; 714/746, 714/756, 758–759, 798–799
See application file for complete search history.

(56) References Cited

U.S. PATENT DOCUMENTS

| | | | |
|---|---|---|---|
| 5,883,869 A * | 3/1999 | Tamai et al. ............. | 369/47.32 |
| 6,243,845 B1 * | 6/2001 | Tsukamizu et al. ......... | 714/769 |
| 6,311,305 B1 * | 10/2001 | Sollish et al. ............... | 714/784 |
| 6,332,207 B1 * | 12/2001 | Southerland et al. ....... | 714/763 |
| 6,345,374 B1 * | 2/2002 | Tsuda ......................... | 714/746 |
| 6,378,103 B1 * | 4/2002 | Han ............................ | 714/769 |
| 6,396,787 B1 * | 5/2002 | Lee et al. ................. | 369/59.18 |
| 6,483,882 B1 * | 11/2002 | O'Dea ......................... | 375/343 |
| 6,492,920 B1 * | 12/2002 | Oki et al. .................... | 341/106 |
| 6,732,320 B1 * | 5/2004 | Tran ............................ | 714/765 |
| 6,778,104 B1 * | 8/2004 | Chen et al. ................. | 341/59 |
| 6,907,559 B1 * | 6/2005 | Hall et al. .................. | 714/769 |

* cited by examiner

*Primary Examiner*—Peguy Jeanpierre
*Assistant Examiner*—Khai Nguyen
(74) *Attorney, Agent, or Firm*—Jianq Chyun IP Office

(57) ABSTRACT

An EFM data decoding method and apparatus thereof for optical disk system is provided. According to the method, a 14-bit data complying with the EFM modulation criteria but failing to correspond to a 8-bit data based on an EFM decoding table is transformed successfully by looking up an expanded EFM decoding table. The expanded EFM decoding table includes probable 8-bit data corresponding to the erroneous data complying with the EFM modulation criteria. Reliability of data reading is thus enhanced in the present invention.

20 Claims, 4 Drawing Sheets

EFM DATA DECODING METHOD AND APPARATUS THEREOF FOR OPTICAL DISK SYSTEM

CROSS-REFERENCE TO RELATED APPLICATION

This application claims the priority benefit of Taiwan application serial no. 93105482, filed on Mar. 3, 2004.

BACKGROUND OF THE INVENTION

1. Field of Invention

The present invention relates to a decoding method and an apparatus thereof for reading an optical disk, and more particularly, to an Eight to Fourteen Modulation (EFM) data decoding method for reading an optical disk.

2. Description of Related Art

In order to comply with configurations of optical disks and to increase reliability of reading data from an optical disk, a data is first modulated with EFM (eight-to-fourteen modulation) and Reed-Soloman coding, and then scrambled with an interleave method before storing thereto.

When burning a compact disk (CD), the status of a memory unit therein is not changed (i.e. burned) only if the corresponding data bit is logic 1. That is, the status of a memory unit is burned when a data bit is logic 1 and not burned when a data bit is logic 0. An 8-bit data is transform into a 14-bit data with the EFM method before storing to the disk. The 14-bit data modulated with EFM method complying with the following criteria, i.e., the data storing (burning) status is performed no shorter than 3 EFM clock cycles long, and no longer than 11 EFM clock cycles. Take a 14-bit data as an example, number of bits being logic 0 therein is no less than 2 nor larger than 10 for a data between at least a pair of two adjacent logic 1 bits.

The foregoing EFM modulation comply with a digital versatile disk (DVD) as well, whereas an 8-to-16-bit modulation is performed instead of conventional 8-to-14-bit. The burning criteria are thus modified that the burning status being no shorter than 3 EFM clock cycles, and being no longer than 11 EFM clock cycles.

As reading rate of an optical disk is increased, e.g. 40-time playback speed and up, scratches may be formed on the disk, as a result, the data bits may be unsuccessfully or erroneously read (e.g. logic 1 data being misread as logic 0). Also a 14-bit data not complying with EFM modulation criteria as described above or an erroneous 14-bit data complying with EFM modulation criteria may result in, for example, misread 00100010000100 as 00100001000100. When reading error occurs, an errant data is read from the optical disk and thus procedures thereafter are adversely influenced, e.g. error correction procedures being more burdened.

SUMMARY OF THE INVENTION

The present invention is directed to an EFM data decoding method and apparatus thereof for an optical disk system capable of reading an erroneous data complying with EFM modulation criteria. Therefore, the reading reliability is enhanced, and the data access failure is avoided.

One embodiment of the present invention is directed to an EFM data decoding method for an optical disk system, including: receiving a data series; extracting a first data from the data series coded with a first bit format; transforming the first data into a second data coded with a second bit format via looking up corrected EFM decoding table. Herein, the corrected EFM decoding table includes a format transforming data for transforming data not complying with EFM modulation criteria, such that the first data can comply with EFM coding criteria by referring to the corrected EFM decoding table. Moreover, when a corresponding second data is not found in the corrected EFM decoding table, an expanded decoding table is looked up for transforming the first data into a second data coded with a second bit format. It is noted that the expanded decoding table includes probable second data corresponding to a portion of the first data complying with EFM criteria but not complying with the corrected EFM decoding table. The second data is outputted thereafter.

One embodiment of the present invention is further directed to an EFM data decoding method for an optical disk system, including: receiving a data series; extracting a first data coded with a first bit format from the data series; modifying the first data to comply with the EFM criteria when the first data does not comply with EFM criteria; transforming the first data into a second data coded with a second bit format via looking up the EFM decoding table; transforming the first data into a second data coded with a second bit format by looking up to the expanded decoding table when a corresponding second data is not found in the EFM decoding table, wherein the expanded decoding lookup table includes a portion of the first data complying with EFM modulation criteria but not complying with EFM decoding lookup table, and the possible corresponding second data; and outputting the second data.

One embodiment of the present invention further is directed to an EFM decoding method for and optical disk system, including the following steps. Receiving a data series; extracting a first data coded with a first bit format from the data series; transforming the first data to a second data coded with a second bit format via looking up EFM decoding table; transforming the first data into the second data coded with a second bit format by looking up an expanded EFM decoding table when a corresponding second data is not found in the EFM decoding lookup table, wherein the expanded decoding lookup table includes the first data complying with EFM modulation criteria but not complying with EFM decoding lookup table; and outputting the second data.

In one aspect of the present invention, a data not complying with EFM modulation criteria refers to the following incidences. First, a number of logic 0 in the first data between two adjacent logic 1 bits is less than two. Second, a number of logic 0 in the first data between two adjacent logic 1 bits is more than 10.

In an aspect of the present invention, the first bit format serves for 14-bit coding, and the second bit format serves for 8-bit coding. When the first bit format is a 16-bit coding, the first data is transformed into a 12-bit data for further coding with 8-bit format.

In as aspect of the present invention, the second data corresponding to the expanded table includes a data derived from the first data having a logic 1 being shifted by one bit towards the left or the right, a data derived from the first data having a least significant bit (LSB) transformed from logic 0 into logic 1, and a data derived from the first data having a most significant bit (MSB) transformed from logic 0 into logic 1. Wherein, the least significant bit usually means the last bit of a data, and the most significant bit usually means the first bit of a data.

Since the present invention is directed to dealing with erroneous data complying with EFM modulation criteria, wherein the erroneous data is replaced with a probable data in order to facilitate further procedures, the data reliability is thus increased, and reading failure is consequently reduced.

DESCRIPTION OF THE EMBODIMENTS

Figure 1:
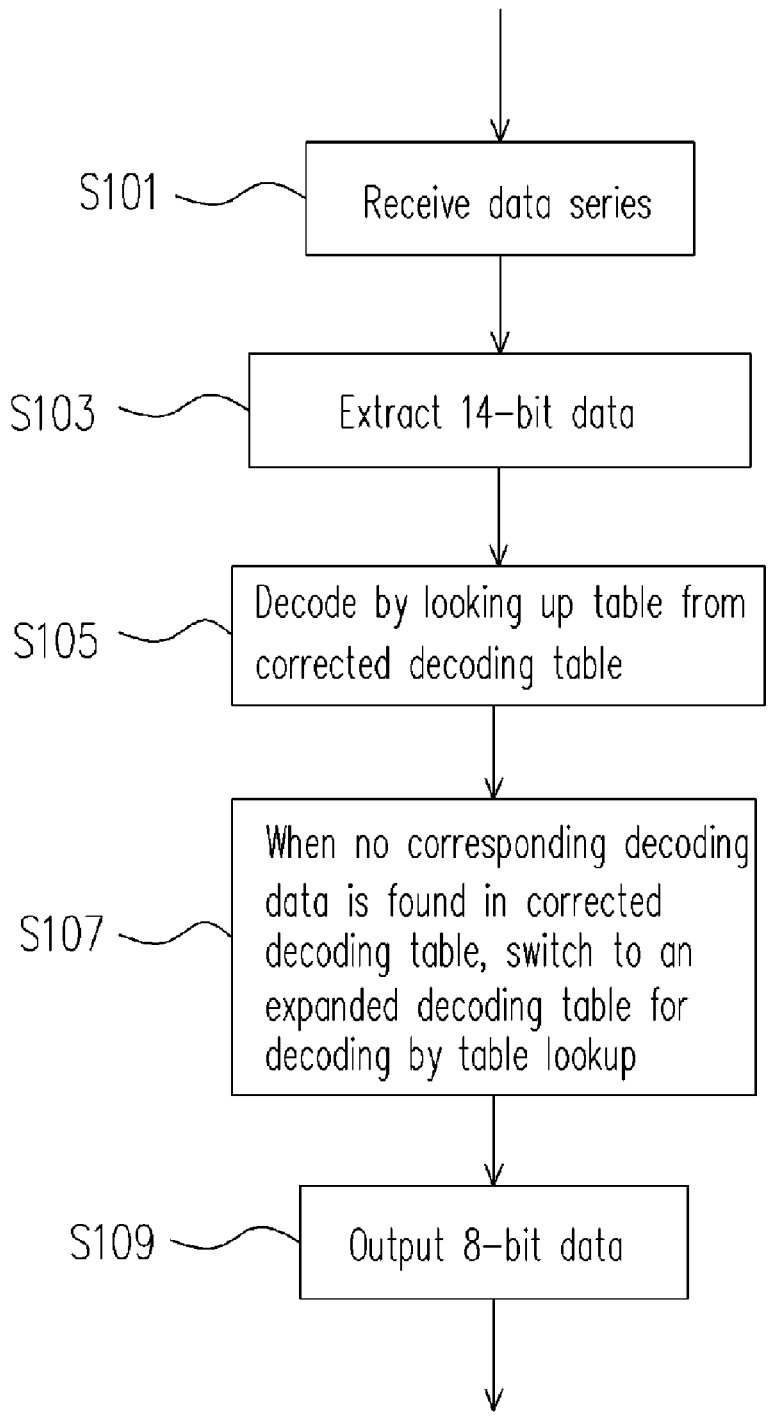
FIG. 1 is a schematic flow chart diagram illustrating an EFM data decoding method for an optical disk system according to one embodiment of the present invention.

Referring to FIG. 1, a flow chart diagram of an EFM decoding method for an optical disk system according to an embodiment of the present invention is shown. The optical disk system, according to an embodiment of the present invention, could be a read-only compact disk system (CD-ROM) or a digital versatile disk (DVD) system. In step S101, a data series is received, e.g., a radio frequency (RF) data is retrieved via laser reflection from an optical disk and is processed with a shaper circuit before generating the data series. In step S103, a 14-bit data to be EFM decoded is extracted from the data series. Next, in step S105, the 14-bit data is transformed into an 8-bit data by looking up the corrected EFM decoding table, which includes a 14-to-8-bit data transformation information not complying with EFM modulation criteria. If a complying decoding data is not found in step S105, the 14-bit data is determined as an incorrect data instead of a correct data complying with EFM modulation criteria. Next, in step S107, an expanded decoding table is looked up for decoding. Step S109 is finally performed to output an 8-bit data.

In step S107, the expanded decoding table as recited above includes data corresponding to erroneous data that comply with the EFM modulation criteria. Since reading RF data from the optical disk may fail due to damages to the optical disk, for example, the corrected decoding table is adapted to data not complying with EFM modulation criteria with correction step described in step S105. It is to be noted that erroneous data complying with the EFM modulation criteria cannot be corrected. Therefore a specific method is provided in the expanded decoding table for this given condition.

In the expanded decoding table, a 14-bit data complying with the EFM modulation criteria may correspond to a data selected from one of the following: a data having a bit being logic 1 shifted by one bit towards left or right, a data with the least significant bit (LSB) is transformed from logic 0 into logic 1, and a data with the most significant bit (MSB) is transformed from logic 0 into logic 1.

For example, when a given 14-bit data is 00010001000100, although this data comply with EFM modulation criteria, it implies an erroneous data if a corresponding 8-bit data is not found in the corrected decoding table. To obtain probable corresponding data, referring to Table 1, the three 1's are shifted to the left and to the right by one bit respectively, and thus six probable data are obtained. Moreover, the MSB and LSB of the 14-bit data are logic 0, changing the specific bits from logic 0 to 1 results in two more expanded sets of data. Therefore when the LSB logic 0 of the 14-bit data is changed to 1, the 14-bit data in this embodiment becomes 00010001000101, where the three LSBs of the data do not comply with the EFM modulation criteria, thus is not listed in the expanded decoding table. It should be noted that each given data in the expanded decoding table comply with the EFM modulation criteria; those not complying with the EFM modulation criteria are excluded from the following table.

TABLE 1

| Original 14-bit data | 00010001000100 |
|---|---|
| expanded 14-bit data0 | 00100001000100 |
| | 00001001000100 |
| | 00010010000100 |
| | 00010000100100 |
| | 00010001001000 |
| | 00010001000010 |
| | 10010001000100 |

According to Table 1, a 14-bit data can be expanded to at least one additional data, wherein the data to be chosen in the expanded decoding table could be done by random, by turns, or by a specific weighting method. The invention does not limit how to choose a data form the table. Although an erroneous data may still be chosen based on the above methods, an Error Correction Code (ECC) and Error Detection Code (EDC) can be applied for further debugging without causing extra burden. Furthermore, according to an embodiment of the present invention, after the analog data is transformed into a digital data, the data is corrected. When a data is found not complying with the data in the decoding table, a most probable EFM data is provided. Adversely, if an incorrect choice occurs, correction rate remains unchanged since the data is supposed to be an error, therefore correctness is not influenced.

For those skilled in the art would appreciate that the method according to an embodiment of the present invention can also be applied to DVD, wherein the EFM modulation is replaced with 8-to-16-bit modulation. The difference is shown in step S103 where a 16-bit data is extracted. However, when using a table lookup method for 16-bit decoding, the table would be expanded to a tremendous size that is not applicable. Therefore a 16-to-12-bit decoding is inserted into the step, which is described in the following formula.

$$dvdcw = \{nst, //dvdcw[11]$$
$$EFMD[15], //dvdcw[10]$$
$$(EFMD[14] \text{ or } EFMD[13]), //dvdcw[9]$$
$$(EFMD[14] \text{ or } EFMD[12]), //dvdcw[8]$$
$$(EFMD[11] \text{ or } EFMD[10]), //dvdcw[7]$$
$$(EFMD[11] \text{ or } EFMD[9]), //dvdcw[6]$$
$$(EFMD[8] \text{ or } EFMD[7]), //dvdcw[5]$$
$$(EFMD[8] \text{ or } EFMD[6]), //dvdcw[4]$$
$$(EFMD[5] \text{ or } EFMD[4]), //dvdcw[3]$$
$$(EFMD[5] \text{ or } EFMD[3]), //dvdcw[2]$$
$$(EFMD[2] \text{ or } EFMD[1]), //dvdcw[1]$$
$$(EFMD[2] \text{ or } EFMD[0])\}, //dvdcw[0]$$

where dvdcw is the 12-bit data after coding, EFMD is the 16-bit data, and nst is the status of a next 16-bit data.

Generally speaking, the coding is to group every 3 bits of the 16-bit data into corresponding 2 bits to form a 12-bit data, where the 16th bit EFMD[15] of the 16-bit data is corresponded to the 11 th bit dvdcw[10] of the 12-bit data, and the 12th bit of the 12-bit data is corresponded depending on the status of the next 16-bit data.

After the foregoing steps, the step S105 is replaced with looking up in a 12-to-8 decoding table, for transforming the 12-bit data to an 8-bit data before proceeding to the following procedures. The corrected 12-to-8-bit decoding table includes a perverted 12-to-8-bit transformation information. That is, the 12-bit data obtained from table lookup is not coded from a 16-bit data complying with modulation criteria, but from a 16-bit data not complying with modulation criteria of the optical disk system. For example, in the perverted 16-bit data, a number of logic 0 bits in a data between two adjacent logic 1 bits is less than two. In Table 2, part of corrected decoded table is shown, where bracketed 16-bit data refer to perverted 16-bit disk system, and bracketed 12-bit data refers to those corresponding to the perverted 16-bit data.

TABLE 2

| 16-bit data | 12-bit data | 8-bit data |
|---|---|---|
| 16'h2009 | 12'h205 | 8'h0 |
| (16'h2005) | (12'h203) | 8'h0 |
| (16'h2005) | (12'h203) | 8'h0 |
| 16'h4120 | 12'h33c | 8'h0 |
| (16'h40a0) | (12'h32c) | 8'h0 |
| 16'h0480 | 12'h0a0 | 8'h0 |
| 16'h0480 | 12'h8a0 | 8'h0 |
| (16'h0500) | (12'h0b0) | 8'h0 |
| (16'h0500) | (12'h8b0) | 8'h0 |

Figure 2:
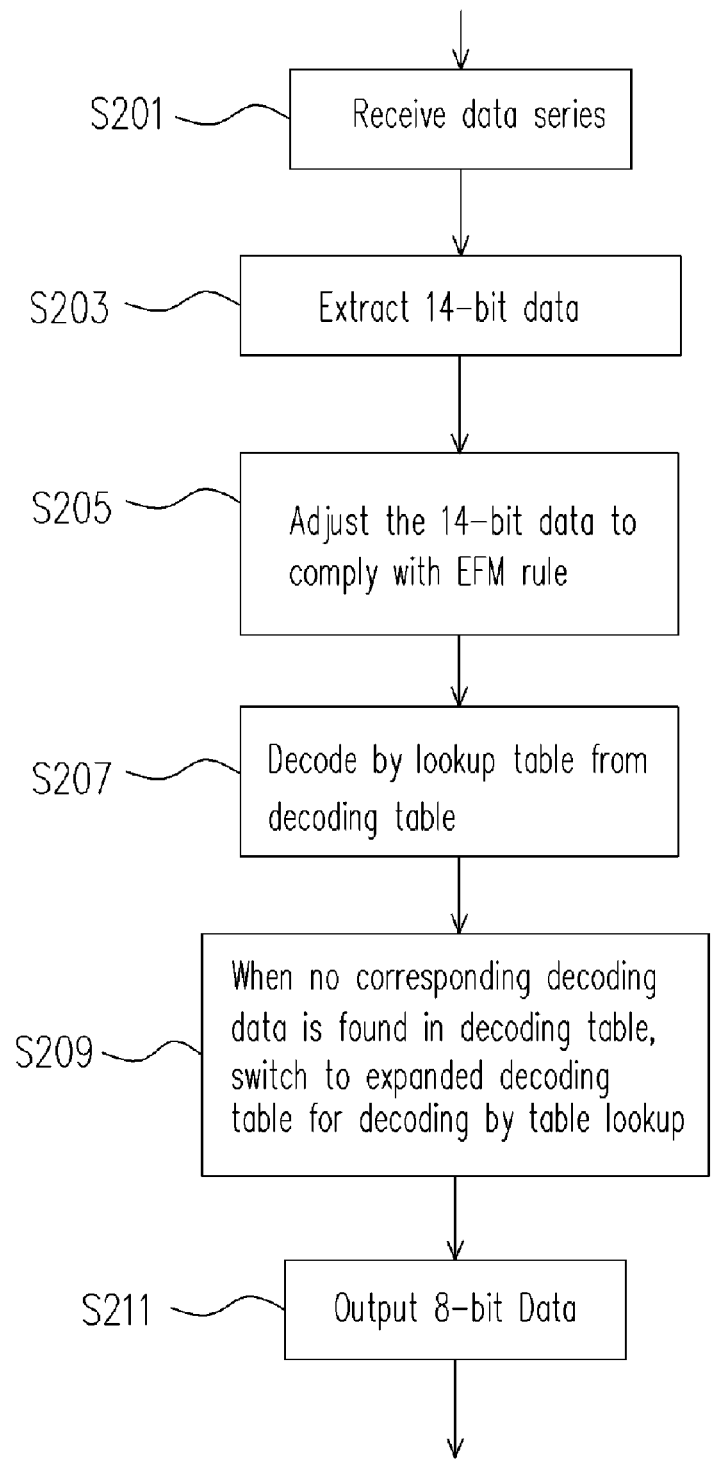
FIG. 2 is a schematic flow chart diagram illustrating an EFM data decoding method for an optical disk system according to another embodiment of the present invention.

Referring to FIG. 2, a flow chart of the EFM decoding method adapted to an optical disk system according to another embodiment of the present invention is illustrated. When the optical disk system is a CD-ROM, the method includes the following steps. First, in step 201, a data series is received. Next, in step S203, a 14-bit data to be decoded is extracted from the data series. Next, in step S205, whether or not the 14-bit data comply with EFM modulation criteria is determined, and the 14-bit data is meaningfully adjusted when the 14-bit data is found not complying with the EFM modulation criteria. Next, in step S207, the 14-bit data is transformed into an 8-bit data by looking up the EFM decoding table. In step S207, if corresponding decoding information is not found in the EFM decoding table, the 14-bit data is referred to as an erroneous data even the 14-bit data is found to comply with the EFM modulation criteria. Next, in step S209, an expanded decoding table is looked up, and a decoded 8-bit data is obtained thereby and outputted in step S211. The expanded decoding table mentioned in step S209 is capable of transforming erroneous data complying with the EFM modulation criteria to a probable correct data correspondingly before precede to the subsequent steps.

It is apparent for those skilled in the art that the method described above can also be applied to DVD, wherein 8-to-16-bit modulation can be replaced with EFM method. Therefore, the data receiving step in the step S203 is modified to transform the 16-bit data to a most probable correct data before proceeding to step S205, and the 16-bit is transformed into a 12-bit data thereby. The 12-bit data is decoded to an 8-bit data via looking up decoding table in step S207 before proceeding to the subsequent steps. The foregoing decoding method is similar to that described with reference to FIG. 1.

Figure 3:
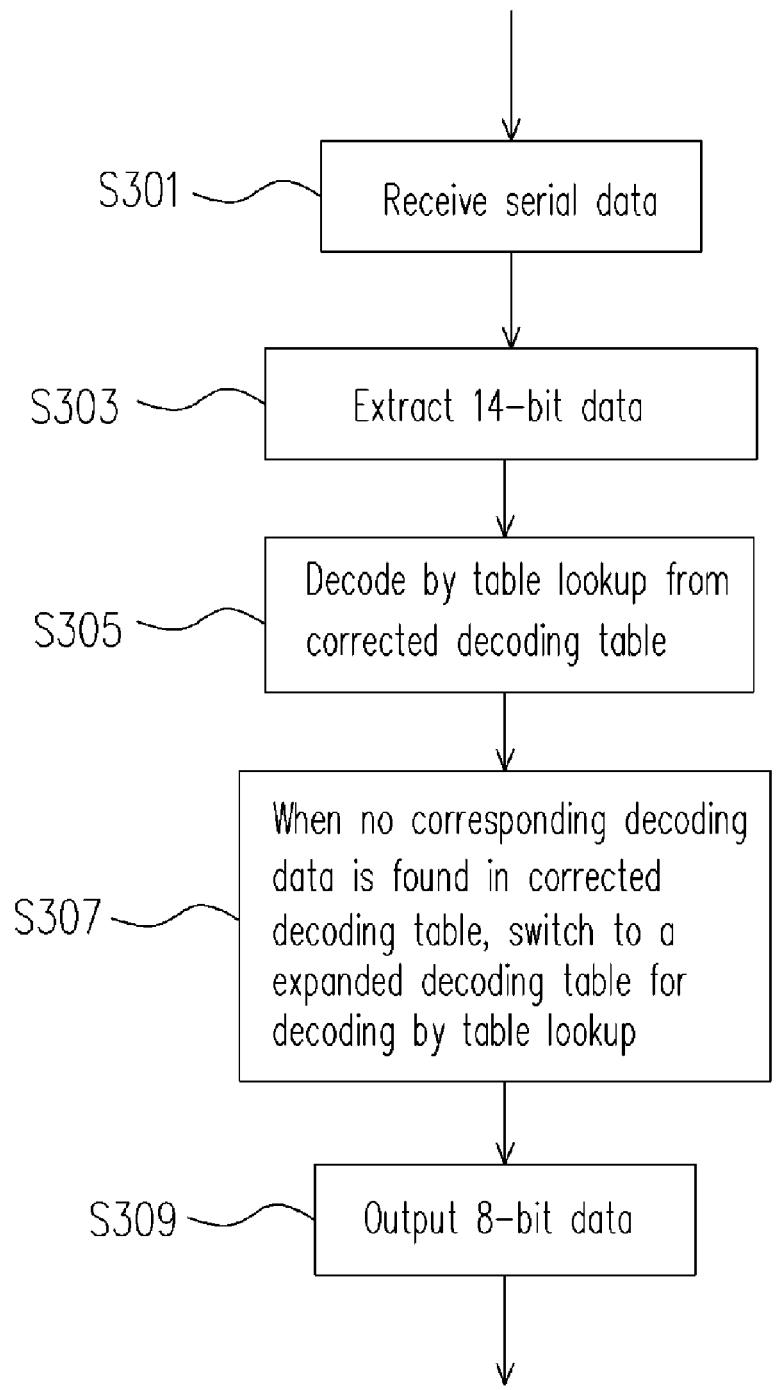
FIG. 3 is a schematic flow chart diagram illustrating an EFM data decoding method for an optical disk system according to another embodiment of the present invention.

Referring to FIG. 3, another flow chart of EFM data decoding method according to an embodiment of the present invention is illustrated. When the optical disk system therein is a CD-ROM, the method includes the following steps. First, a data series is received. Next, in step S303, a 14-bit data is extracted and transformed to generate the data series. Next, in step S305, the 14-bit data is decoded to an 8-bit data via looking up the EFM decoding table. In step S305, the 14-bit data is determined an erroneous data even when the 14-bit data comply with EFM modulation criteria when a corresponding decoding information is not found in the EFM decoding table. Next, in step S307, an expanded decoding table is looked up. Thereafter, in step S309, a decoded 8-bit data is output. It should be noted that the expanded decoding table recited in the step S307 functions similar to that of the expanded decoding table in the description of FIG. 3, where an erroneous data complying with the EFM modulation criteria is transformed into a correct data before proceeding to the subsequent steps.

It is apparent for those skilled in the art that the method according to the present embodiment of the present invention can also applied to a DVD player, wherein an 8-to-16-bit modulation is performed instead of 8-to-14-bit modulation. Therefore in step S303, a 16-bit data is read firstly, and is transformed to a 12-bit data thereby. The coding method is substantially similar to that of FIG. 1 for DVD decoding. On the other hand, a 12-to-8 bit decoding is performed via lookup table in step S306 before proceeding to subsequent steps.

Figure 4:
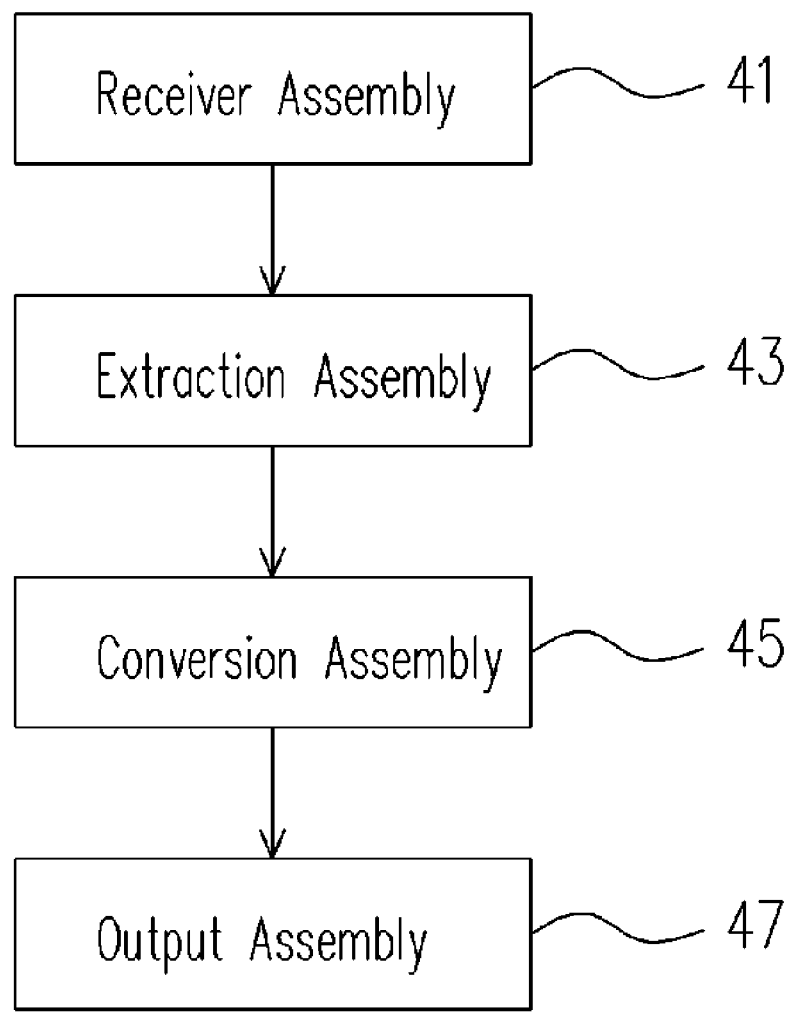
FIG. 4 is a schematic block diagram illustrating an EFM data decoding apparatus for an optical disk system according to one embodiment of the present invention.

Referring to FIG. 4, an apparatus adapted for EFM data decoding for an optical disk system according to one embodiment of the present invention is illustrated. In FIG. 4, the apparatus includes the following components: a receiver assembly 41, for receiving a data series; an extraction assembly 43, for extracting a first data coded with a first bit format; a conversion assembly 45, for transforming the first data to a second data coded with a second bit format according to EFM coding table or according to an expanded decoding table when the EFM coding table does not apply; and an output assembly 47, for outputting the second data.

In an embodiment of the present invention, the conversion assembly further provides additional functions as described below. When the first bit format being 14-bit format therewith the extraction assembly 43, the second bit format is designated to 8-bit format. Whereas when the first bit format is 16-bit format therewith the extraction assembly 43, the first data is transformed into an intermediate 12-bit format before being transformed into 8-bit data decoded with the second bit format. Therefore, the embodiment in the present invention is not limited to data formats of various optical disks, for example, CD, VCD, and DVD, etc.

In the embodiment, the expanded table includes the probable second data corresponding to the first data complying with the EFM modulation criteria and not complying with the EFM decoding table. Moreover, the data not complying with EFM modulation criteria includes one selected from a group consisting of: the number of logic 0 bits in the first data between two adjacent logic 1 is less than two, the number of logic 0 bits in the first data between two adjacent logic 1 is larger than 10, and a combination of the above two.

The corresponding second data in the expanded decoding table as described above is selected from a group consisting of: (a) the resulting data from the first data in which a bit being logic 1 is being shifted towards the left; (b) the resulting data from the first data in which a bit being logic 1 is being shifted towards the right; (c) the resulting data from the first data in which the LSB being logic 0 is being transformed to logic 1; and (d) the resulting data from the first data in which the MSB being logic 0 is being transformed to logic 1. When the first data complying with EFM modulation criteria but not complying with the corrected EFM decoding table is transformed by the conversion assembly 45, at least one probable corresponding data is found from the expanded decoding table. According to an embodiment of the present invention, the method of selecting the probable corresponding data via the conversion assembly 45 can be implemented by random, by turns or by a specific weighting method.

In light of the above descriptions, the present invention is directed to process erroneous data complying with EFM modulation criteria, and to replace the erroneous data with a most probable data selected from the expanded decoding table before proceeding with the subsequent steps. Accordingly, data reliability is promoted, and the reading failure is reduced.

Although the invention has been described with reference to a particular embodiment thereof, it will be apparent to those skilled in the art that modifications to the described embodiment may be made without departing from the spirit of the invention. Accordingly, the scope of the invention will be defined by the attached claims and not by the above detailed description.

What is claimed is:

1. An Eight to Fourteen Modulation (EFM) decoding method for an optical disk system, comprising:
   receiving a data series;
   extracting a first data coded with a first bit format from the data series; and
   looking up a corrected EFM decoding table for transforming the first data into a second data coded with a second bit format, wherein the corrected EFM decoding table comprises format transforming information for transforming data not complying with the EFM modulation criteria;
   looking up an expanded decoding table when the second data corresponding to the first data is not found in the corrected EFM decoding table for transforming the first data to the second data coded with the second bit format, wherein the expanded decoding table comprises the second data corresponding to portion of the first data that complies with the EFM modulation criteria but not complies with the corrected EFM decoding table; and
   outputting the second data.

2. The method as recited in claim 1, further comprising:
   referring the second bit format as 8-bit coding when the first bit format is referred as 14-bit coding; and
   transforming the first data into a 12-bit coding format before being successively coded with 8-bit coding as the second bit format when the first bit format is referred as 16-bit coding.

3. The method as recited in claim 1, wherein the condition referred as not complying with the EFM modulation criteria is chosen form a group consisting of the following: a number of logic 0 bits of the first data between two adjacent logic 1 bits is less than 2, a number of logic 0 bits of the first data between two adjacent logic 1 bits is more than 10, and a combination of the above two.

4. The method as recited in claim 1, wherein the second data corresponding to the expanded decoding table is selected from a group consisting of:
   a data derived from the first data wherein a bit being logic 1 is being shifted towards the left;
   a data derived from the first data wherein a bit being logic 1 is being shifted towards the right;
   a data derived from the first data wherein a least significant bit being logic 0 is being transformed into logic 1; and
   a data derived from the first data wherein the most significant bit being logic 0 is being transformed into logic 1.

5. The method as recited in claim 1, wherein when the first data complying with the EFM modulation criteria but not complying with the corrected EFM decoding table, at least one probable expanded decoding data corresponding to the first data is found from the expanded decoding table, and a method of selecting the probable expanded decoding data is selected from a group consisting of a random method, a by turns method and a weighting method.

6. An EFM data decoding method for an optical disk system, comprising:
   receiving a data series;
   extracting a first data coded with a first bit format from the data series;
   modifying the first data to comply with an EFM modulation criteria when the first data does not comply with the EFM modulation criteria;
   transforming the first data into a second data coded with a second bit format by looking up an EFM decoding table;
   looking up an expanded decoding table for transforming the first data into the second data coded with the second bit format when the second data corresponding to the first data is not found in the EFM decoding table, wherein the expanded decoding table comprises a portion of the second date that the corresponding portion of the first data complying with the EFM modulation criteria but not complying with the EFM decoding table; and
   outputting the second data.

7. The method as recited in claim 6 further comprising:
   referring the second bit format as 8-bit coding when the first bit format is referred as 14-bit coding; and
   transforming the first data into a 12-bit coding format before the first data is successively coded with 8-bit coding as the second bit format when the first bit format is referred as 16-bit coding.

8. The method as recited in claim 6, wherein the conditions that are referred as not complying with the EFM modulation criteria comprise one selected from a group consisting of: a number of logic 0 bits of the first data between two adjacent logic 1 bits is less than 2, a number of logic 0 bits of the first data between two adjacent logic 1 bits is more than 10, and a combination of the above two.

9. The method as recited in claim 6, wherein the second data corresponding to the expanded decoding table is selected from a group consisting of:
   a first data derived from the first data wherein a bit being logic 1 is being shifted towards the left;
   a second data derived from the first data wherein a bit being logic 1 is being shifted towards the right;
   a third data derived from the first data wherein a least significant bit being logic 0 is being transformed into logic 1; and a fourth data derived from the first data wherein the most significant bit being logic 0 is being transformed into logic 1.

10. The method as recited in claim 6, wherein when the first data complying with the EFM modulation criteria but not complying with the corrected EFM decoding table, at least one probable expanded decoding data corresponding to the first data is found from the expanded decoding table, and a method of selecting the probable expanded decoding data is selected from a group consisting of a random method, a by turns method and a weighting method.

11. An EFM data decoding method for an optical disk system, comprising:
   receiving a data series;
   extracting a first data coded with a first bit format from the data series; and
   looking up table from an EFM decoding table for transforming the first data into a second data coded with a second bit format;
   looking up an expanded decoding table for transforming the first data into the second data coded with the second bit format when the second data corresponding to the first data is not found in the EFM decoding table, wherein the expanded decoding table comprises a portion of the second date that the corresponding portion of the first data complying with the EFM modulation criteria but not complying with the EFM decoding table; and
   outputting the second data.

12. The method as recited in claim 11 further comprising:
   referring the second bit format as 8-bit coding when the first bit format is referred as 14-bit coding; and
   transforming the first data into a 12-bit coding format before the first data is coded with 8-bit coding as the second bit format when the first bit format is referred as 16-bit coding.

13. The method as recited in claim 11, wherein the conditions that are referred as not complying with the EFM modulation criteria comprise one selected from a group consisting of a number of logic 0 bits of the first data between less than two adjacent logic 1 bits is less than 2, a number of logic 0 bits of the first data between two adjacent logic 1 bits is more than 10, and a combination of the above two.

14. The method as recited in claim 11, wherein the second data corresponding to the expanded decoding table is selected from a group consisting of:
   a first data derived from the first data wherein a bit being logic 1 being shifted towards the left;
   a second data derived from the first data wherein a bit being logic 1 being shifted towards the right;
   a third data derived from the first data wherein a least significant bit being logic 0 being transformed into logic 1; and
   a fourth data derived from the first data wherein the most significant bit being logic 0 being transformed into logic 1.

15. The method as recited in claim 11, wherein when the first data comply with the EFM modulation criteria but not complying with the corrected EFM decoding table, at least one probable expanded decoding data corresponding to the first data is found from the expanded decoding table, and a method of selecting the probable expanded decoding data is selected from a group consisting of: a random method, by turns method and a weighting method.

16. An apparatus for EFM data decoding used in an optical disk system, comprising:
   a receiver assembly, for receiving a data series;
   an extraction assembly, for extracting a first data coded with a first bit format;
   a conversion assembly, for transforming the first data to a second data coded with a second bit format according to an EFM coding table and an expanded decoding table, wherein the expanded decoding table comprises the second data corresponding to the first data complying with the EFM modulation criteria but not complying with the EFM decoding table; and
   an output assembly, for outputting the second data.

17. The apparatus as recited in claim 16, wherein the extraction assembly further comprising:
   when the first bit format is referred as 14-bit coding therein the extraction assembly, the second bit format is referred as 8-bit coding therein the conversion assembly; and
   when the first bit format is referred as 16-bit coding therein the extraction assembly, the first data is transformed into a 12-bit coding format before transformed into the second bit format performing an 8-bit coding therein the conversion assembly.

18. The apparatus as recited in claim 16, wherein the conditions that are referred as not complying with the EFM modulation criteria comprise one selected from a group consisting of: a number of bits being logic 0 of the first data between two adjacent logic 1 bits is less than 2, a number of logic 0 bits of the first data between two adjacent logic 1 bits is more than 10, and a combination of the above two.

19. The apparatus as recited in claim 16, wherein the second data corresponding to the expanded decoding table is selected from a group consisting of:
   a first data derived from the first data wherein a bit being logic 1 being shifted towards the left;
   a second data derived from the first data wherein a bit being logic 1 being shifted towards the right;
   a third data derived from the first data wherein a least significant bit being logic 0 being transformed into logic 1; and
   a fourth data derived from the first data wherein the most significant bit being logic 0 being transformed into logic 1.

20. The apparatus as recited in claim 16, wherein when the first data comply with the EFM modulation criteria but not complying with the corrected EFM decoding table therein the conversion assembly, at least one probable expanded decoding data corresponding to the first data is found from the expanded decoding table, and a method of selecting the probable expanded decoding data therein the conversion assembly is selected from a group consisting of: a random method, by turns method and a weighting method.

* * * * *